(12) United States Patent
Nishi et al.

(10) Patent No.: US 9,171,771 B2
(45) Date of Patent: Oct. 27, 2015

(54) SEMICONDUCTOR UNIT WITH COOLER

(71) Applicant: KABUSHIKI KAISHA TOYOTA JIDOSHOKKI, Aichi-ken (JP)

(72) Inventors: Shinsuke Nishi, Kariya (JP); Shogo Mori, Kariya (JP); Yuri Otobe, Kariya (JP); Naoki Kato, Kariya (JP)

(73) Assignee: KABUSHIKI KAISHA TOYOTA JIDOSHOKKI, Aichi-Ken (JP)

( * ) Notice: Subject to any disclaimer, the term of this patent is extended or adjusted under 35 U.S.C. 154(b) by 0 days.

(21) Appl. No.: 13/834,766

(22) Filed: Mar. 15, 2013

(65) Prior Publication Data

US 2013/0264702 A1    Oct. 10, 2013

(30) Foreign Application Priority Data

Apr. 6, 2012  (JP) ................ 2012-087639
Aug. 2, 2012  (JP) ................ 2012-172101

(51) Int. Cl.
| | |
|---|---|
| *H01L 23/34* | (2006.01) |
| *H01L 23/28* | (2006.01) |
| *H01L 23/04* | (2006.01) |
| *H01L 23/495* | (2006.01) |

(Continued)

(52) U.S. Cl.
CPC ............ *H01L 23/36* (2013.01); *H01L 23/3107* (2013.01); *H01L 23/3735* (2013.01); *H01L 23/473* (2013.01); *H01L 2924/0002* (2013.01)

(58) Field of Classification Search
CPC ........... H01L 2924/01079; H01L 2924/01078; H01L 2224/16; H01L 23/473; H01L 23/427; H01L 23/367; H01L 23/4006

USPC ......... 257/712, 713, 714, 722, 787, 796, 730, 257/731, 675
See application file for complete search history.

(56) References Cited

U.S. PATENT DOCUMENTS

| | | | |
|---|---|---|---|
| 8,283,773 | B2 | 10/2012 | Mori et al. |
| 8,299,606 | B2 | 10/2012 | Mori et al. |

(Continued)

FOREIGN PATENT DOCUMENTS

| | | |
|---|---|---|
| CN | 101752331 A | 6/2010 |
| CN | 101889485 A | 11/2010 |

(Continued)

OTHER PUBLICATIONS

U.S. Appl. No. 13/862,861 to Yoshitaka Iwata et al., which was filed Apr. 15, 2013.

(Continued)

*Primary Examiner* — A. Sefer
*Assistant Examiner* — Dilinh Nguyen
(74) *Attorney, Agent, or Firm* — Greenblum & Bernstein, P.L.C.

(57) ABSTRACT

A semiconductor unit includes a cooler having a fluid flow space, an insulating substrate bonded to the cooler through a metal, a semiconductor device soldered to the insulating substrate, an intermediate member interposed between the insulating substrate and the fluid flow space and having a first surface where the insulating substrate is mounted, and a mold resin having a lower coefficient of liner expansion than the intermediate member. The insulating substrate, the semiconductor device and the cooler are molded by the mold resin. The intermediate member has a second surface that extends upward or downward relative to the first surface. The first surface is covered by the mold resin. The second surface is covered by a resin cover.

18 Claims, 6 Drawing Sheets

(51) Int. Cl.
*H01L 23/36* (2006.01)
*H01L 23/31* (2006.01)
*H01L 23/373* (2006.01)
*H01L 23/473* (2006.01)

(56) References Cited

U.S. PATENT DOCUMENTS

| | | | |
|---|---|---|---|
| 8,422,228 | B2 | 4/2013 | Suzuki et al. |
| 8,560,141 | B2 | 10/2013 | Shah et al. |
| 2010/0258274 | A1 | 10/2010 | Van Der Tempel et al. |
| 2011/0029154 | A1* | 2/2011 | Shah et al. .................. 700/300 |

FOREIGN PATENT DOCUMENTS

| | | |
|---|---|---|
| CN | 102027428 A | 4/2011 |
| JP | 2007-329163 | 12/2007 |

OTHER PUBLICATIONS

Chinese Office Action mailed Jun. 3, 2015 in Chinese Patent Application No. 201310118025.7.

* cited by examiner

SEMICONDUCTOR UNIT WITH COOLER

BACKGROUND OF THE INVENTION

The present invention relates to a semiconductor unit.

There is known a semiconductor unit in which a power semiconductor device mounted on one side of a die pad, an insulating plate mounted on the other side of the die pad and a hollow heat exchange member mounted on the side of the insulating plate opposite from the die pad are molded with a mold resin into a module, as disclosed for example in Japanese Unexamined Patent Application Publication No. 2007-329163. Such molded power semiconductor device has high reliability.

There is also known a semiconductor unit in which the hollow heat exchange member is brazed or soldered to the insulating plate.

In the semiconductor unit of such structure, however, the mold resin may be detached from the hollow heat exchange member due to the difference in the coefficient of linear expansion between the mold resin and the hollow heat exchange member.

The present invention is directed to providing a semiconductor unit which prevents such detachment of the mold resin.

SUMMARY OF THE INVENTION

In accordance with an aspect of the present invention, a semiconductor unit includes a cooler having a fluid flow space, an insulating substrate bonded to the cooler through a metal, a semiconductor device soldered to the insulating substrate, an intermediate member interposed between the insulating substrate and the fluid flow space and having a first surface where the insulating substrate is mounted, and a mold resin having a lower coefficient of liner expansion than the intermediate member. The insulating substrate, the semiconductor device and the cooler are molded by the mold resin. The intermediate member has a second surface that extends upward or downward relative to the first surface. The first surface is covered by the mold resin. The second surface is covered by a resin cover.

In accordance with another aspect of the present invention, a semiconductor unit includes a cooler having a fluid flow space, an insulating substrate bonded to the cooler through a metal, a semiconductor device soldered to the insulating substrate, and a mold resin having a lower coefficient of liner expansion than the cooler. The insulating substrate, the semiconductor device and the cooler are molded by the mold resin. The cooler includes a first plate having a first surface where the insulating substrate is mounted; and a second plate having a base, a vertical portion extending upward from the periphery of the base and bonded to the first plate, and an extension extending upward from the vertical portion beyond the first surface. The mold resin covers the first surface and the entire of the extension.

Other aspects and advantages of the invention will become apparent from the following description, taken in conjunction with the accompanying drawings, illustrating by way of example the principles of the invention.

DETAILED DESCRIPTION OF THE EMBODIMENTS

The following will describe the embodiments of the semiconductor unit according to the present invention with reference to the accompanying drawings. It is noted that, in the drawings, some components of the semiconductor unit are shown with exaggerated dimensions for simplicity.

Figure 1:
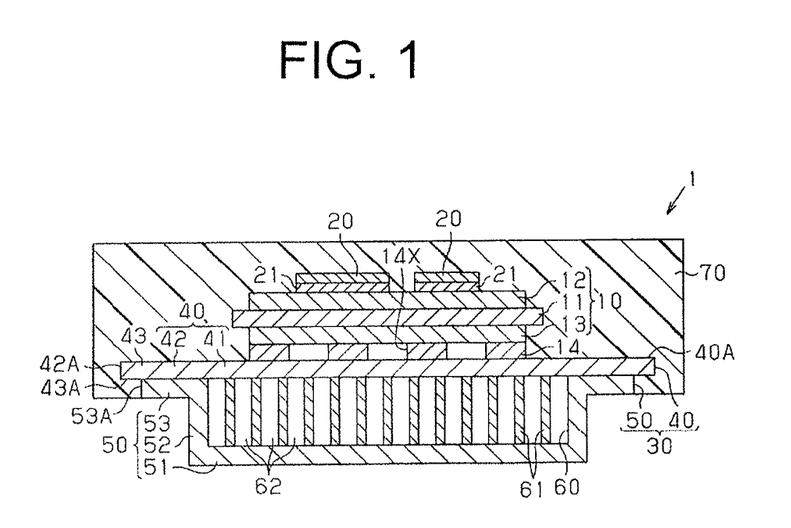
FIG. 1 is a schematic sectional view of a semiconductor unit according to a first embodiment of the present invention.

Referring to FIG. 1, the semiconductor unit of the first embodiment which is designated generally by 1 includes two semiconductor devices 20 mounted on a circuit board 10 and a heat sink 30 thermally coupled to the circuit board 10. The circuit board 10, the semiconductor devices 20 and the heat sink 30 are molded by a mold resin 70. The semiconductor unit 1 is applicable to an inverter for use in a vehicle which converts DC power of a battery into AC power to drive a travel motor of the vehicle.

The circuit board 10 is composed of an insulating substrate 11, a metal plate 12 bonded to the upper surface of the insulating substrate 11, and a metal plate 13 bonded to the lower surface of the insulating substrate 11. The insulating substrate 11 is a rectangular thin plate and provided, for example, by a ceramic substrate that is made of aluminum nitride, alumina or silicon nitride.

The metal plate 12 serves as a wiring layer or an electrode and also serves to release the heat generated by the semiconductor devices 20. The metal plate 12 is made of, for example, an aluminum-based metal or copper. The term "aluminum-based metal" includes pure aluminum and aluminum alloys.

Each of the semiconductor devices 20 is mounted to the metal plate 12 through a solder layer 21. That is, the semiconductor device 20 is soldered to the metal plate 12 of the circuit board 10. The semiconductor device 20 is thermally coupled to the insulating substrate 11 through the metal plate 12. The semiconductor device 20 may be provided, for example, by an insulated gate bipolar transistor (IGBT), a metal oxide semiconductor field effect transistor (MOSFET) or a diode.

The metal plate 13 bonded to the lower surface of the insulating substrate 11 serves to connect the insulating substrate 11 to the heat sink 30 and also to release the heat generated by the semiconductor devices 20. The metal plate 13 is made of, for example, an aluminum-based metal or copper.

A stress relief member 14 in the form of a rectangular plate is provided between the metal plate 13 of the circuit board 10 and the heat sink 30. The stress relief member 14 is made of a material with high thermal conductivity such as an aluminum-based metal. The stress relief member 14 is brazed at its upper surface to the metal plate 13 and at its lower surface to the heat sink 30. That is, metal bonding layers made of brazing metal (not shown) are formed between the stress relief member 14 and the metal plate 13 and between the stress relief member 14 and the heat sink 30. The heat sink 30, the stress relief member 14 and the circuit board 10 are bonded together through a metal. The circuit board 10 and the heat sink 30 are thermally coupled through the stress relief member 14, so that the heat generated by the semiconductor device 20 is transferred through the circuit board 10 and the stress relief member 14 to the heat sink 30.

The stress relief member 14 has plural holes 14X formed therethrough and extending in the direction of its thickness. In other words, the holes 14X of the stress relief member 14 forms a region where the stress relief member 14 is not in contact with the metal plate 13 and the heat sink 30. Such region or the hole 14X allows deformation of the stress relief member 14 and hence reduces the thermal stress occurring in the stress relief member 14.

The heat sink 30 (cooler) is made of a material with high thermal conductivity such as aluminum-based metal. The heat sink 30 has an upper plate 40 (first plate), a lower plate 50 (second plate) and a fluid flow space 60.

The upper plate 40 and the lower plate 50 are brazed together at their outer marginal portions to form therebetween a space that serves as the fluid flow space 60. The fluid flow space 60 thus formed inside the heat sink 30 has plural fins or partition walls 61 extending between the lower plate 50 and the upper plate 40. Each of the partition walls 61 is brazed at its upper and lower ends to the upper and lower plates 40, 50, respectively. The partition walls 61 are spaced at a regular interval and extend parallel to each other. In the fluid flow space 60, each partition wall 61 cooperates with its adjacent partition wall 61 or its adjacent portion of the lower plate 50 to form therebetween a channel 62 through which coolant such as water flows. The fluid flow space 60 with a plurality of channels 62 is disposed at a position immediately below the semiconductor devices 20 that are to be cooled.

Although not shown in the drawing, the heat sink 30 is connected to a supply pipe through which coolant is supplied to the channels 62 and also connected to a discharge pipe through which the coolant having passed through the channels 62 is discharged.

The following will describe in detail the structure of the lower plate 50 and the upper plate 40. The upper plate 40 is brazed at its upper surface 40A to the stress relief member 14 on which the metal plate 13 and the insulating substrate 11 are mounted.

The lower plate 50 has a base 51, a vertical portion 52 and a horizontal bonding portion 53. The base 51 is of a rectangular planar shape and extends horizontally to form the bottom for the fluid flow space 60. The vertical portion 52 extends vertically upward from the periphery of the base 51 to form a side wall for the fluid flow space 60. The bonding portion 53 extends horizontally outwardly from the upper end of the vertical portion 52. The bonding portion 53 extends away from the base 51 or the fluid flow space 60. The bonding portion 53 has a side surface 53A that extends vertically downward relative to the upper surface 40A of the upper plate 40, or extends in the direction that is different from the direction of the upper surface 40A of the upper plate 40.

The upper plate 40 (intermediate member) is of a rectangular planar shape and includes a base 41 and a bonding portion 42. The base 41 extends horizontally to form the top for the fluid flow space 60. The base 41 is brazed at its upper surface to the stress relief member 14.

The bonding portion 42 extends horizontally outwardly from the base 41. The bonding portion 42 extends away from the base 41 or the fluid flow space 60. The bonding portion 42 is brazed at its lower surface to the upper surface of the bonding portion 53 of the lower plate 50. The interior space formed between the upper and lower plates 40, 50 thus bonded together, that is defined by the base 41 of the upper plate 40, the base 51 and the vertical portion 52 of the lower plate 50 corresponds to the fluid flow space 60.

The bonding portion 42 has an extension 43 that extends outwardly beyond the bonding portion 53 of the lower plate 50. The extension 43 has a lower surface 43A that is not in contact with the bonding portion 53 of the lower plate 50. The bonding portion 42 or the extension 43 has a side surface 42A that extends vertically downward from the upper surface 40A of the upper plate 40.

In the heat sink 30, the bonding portions 42, 53 of the upper and lower plates 40, 50 are formed extending outwardly away from the fluid flow space 60 having the partition walls 61. In other words, the heat sink 30 has an outer profile that is slightly larger than the profile of the fluid flow space 60.

In the semiconductor unit 1 of the present embodiment, part of the heat sink 30 and the components mounted thereon are molded by the mold resin 70 in such a way that the mold resin 70 covers the upper surface 40A (first surface) of the upper plate 40, the side surface 42A (second surface) of the bonding portion 42 of the upper plate 40, the lower surface 43A of the extension 43 of the upper plate 40, the side surface 53A of the bonding portion 53 of the lower plate 50, the stress relief member 14, the circuit board 10 and the semiconductor devices 20. The lower surface of the bonding portion 53, the outer surface of the vertical portion 52 and the lower surface of the base 51 of the lower plate 50 are exposed out of the mold resin 70. Thus, the lower surface of the heat sink 30 is exposed out of the mold resin 70. The mold resin 70 is provided by an insulating resin that has a lower coefficient of linear expansion than the heat sink 30. Such molding with the mold resin 70 is performed under a temperature that is lower than the temperature under which the semiconductor device 20 are soldered to the metal plate 12 and also under which the metal plate 13 is brazed to the heat sink 30 and the stress relief member 14, after the stress relief member 14 and the circuit board 10 are brazed to the heat sink 30 and also the semiconductor devices 20 are soldered to the circuit board 10. In the present embodiment, the mold resin 70 serves as a resin cover for covering the side surface 42A of the bonding portion 42 of the upper plate 40.

The following will describe the operation of the semiconductor unit 1 of the present embodiment. The heat generated by the semiconductor devices 20 while the semiconductor unit 1 is energized is transferred through the metal plate 12, the insulating substrate 11, the metal plate 13 and the stress relief member 14 and finally to the heat sink 30. The heat sink 30, the stress relief member 14 and the metal plate 13 bonded together through the metal provides good heat transfer between the metal plate 13 or the circuit board 10 and the heat sink 30, thereby allowing the heat generated by the semiconductor devices 20 to be transferred efficiently to the heat sink 30.

The heat transferred to the heat sink 30 is released therefrom to the coolant which is supplied from a source (not shown) through a supply pipe (not shown) to the channels 62 in the heat sink 30 and flows therethrough in the same direction. Thus, the heat of the semiconductor devices 20 transferred through the stress relief member 14 to the heat sink 30 is released to the coolant flowing in the channels 62. The coolant having passed through the channels 62 is discharged out of the heat sink 30 through a discharge pipe.

Receiving the heat generated by the semiconductor devices 20, the heat sink 30 and its adjacent mold resin 70 are heated and thermally expanded. The difference in the coefficient of linear expansion between the heat sink 30 and the mold resin 70 causes thermal stress in the semiconductor unit 1. In the semiconductor unit 1 of the present embodiment wherein the mold resin 70 covers the side surfaces 42A, 53A of the bonding portions 42, 53 of the upper and lower plates 40, 50, when the heat sink 30 receives a force tending to cause the heat sink 30 to expand horizontally in the extending direction of the bonding surface between the upper plate 40 and the mold resin 70, the side surfaces 42A, 53A of the bonding portions 42, 53 of the upper and lower plates 40, 50 press the mold resin 70, while the bonding portions 42, 53 receive reaction force from the mold resin 70. Such reaction force serves to restrict the expansion of the heat sink 30. If there is a large difference in the coefficient of linear expansion between the heat sink 30 and the mold resin 70, the difference in the amount of expansion between the heat sink 30 and the mold resin 70 is small, which prevents the mold resin 70 from being detached from the heat sink 30.

The semiconductor unit 1 of the first embodiment offers the following advantages.

(1) The circuit board 10, the semiconductor device 20 and the stress relief member 14 are molded integrally with the heat sink 30 by the mold resin 70. There is no need to provide an additional member such as bracket for fixing such components to the heat sink 30, resulting in a reduced size of the semiconductor unit.

(2) The mold resin 70 covers the side surfaces 42A, 53A of the bonding portions 42, 53 which extend downward from the upper surface 40A of the upper plate 40, thereby restricting the horizontal expansion of the heat sink 30. If there is a large difference in the coefficient of linear expansion between the heat sink 30 and the mold resin 70, the difference in the amount of expansion between the heat sink 30 and the mold resin 70 is small, which prevents the mold resin 70 from being detached from the heat sink 30 and hence increases the reliability of the connection between the heat sink 30 and the mold resin 70.

(3) The bonding portion 42 has the extension 43 that extends beyond the bonding portion 53 of the lower plate 50, and the mold resin 70 covers the lower surface 43A of the extension 43. When the heat sink 30 and the mold resin 70 are thermally expanded, the mold resin 70 covering the lower surface 43A of the extension 43 and the upper surface 40A of the upper plate 40 serves to restrict the expansion of the upper plate 40 in the direction of its thickness, which prevents the mold resin 70 from being detached from the side surface 42A of the bonding portion 42. In other words, the provision of the bonding portion 42 having the extension 43 allows the sealing of the whole of the upper plate 40 by the mold resin 70 with the vertical portion 52 of the lower plate 50 exposed out of the mold resin 70. This helps to decrease the amount of the mold resin 70 to be used for sealing and also to prevent thermal deformation of the upper plate 40, resulting in increased reliability of the connection between the upper plate 40 and the mold resin 70.

(4) The bonding portions 42, 53 of the upper and lower plates 40, 50 of the heat sink 30 extend outward of the fluid flow space 60, and the bonding portion 42 is brazed at its lower surface to the upper surface of the bonding portion 53 so that the fluid flow space 60 is formed between the upper plate 40 and the lower plate 50. This leads to an increased bonding area, which makes it easy to braze the upper plate 40 to the lower plate 50.

(5) The circuit board 10, the stress relief member 14 and the heat sink 30 are bonded together through the metal. Such structure provides good heat transfer between the circuit board 10 and the heat sink 30 as compared to the case that the circuit board 10 is bonded to the heat sink 30 through silicone grease, thereby allowing the heat generated by the semiconductor devices 20 to be efficiently transferred to the heat sink 30.

(6) Molding the circuit board 10, the semiconductor devices 20 and part of the heat sink 30 by the resin increases the reliability of the connection of such components and prevents deterioration of the semiconductor unit 1, thus allowing the performance of the semiconductor unit 1 to be maintained for a long period of time.

(7) The lower surface of the heat sink 30 is exposed out of the mold resin 70. This allows a heating element bonded to the lower surface of the heat sink 30 to be cooled.

(8) The stress relief member 14 having the plural holes 14X is interposed between the heat sink 30 and the circuit board 10. The holes 14X serves to disperse and reduce the thermal stress caused by the difference in the coefficient of linear expansion between the heat sink 30 and the insulating substrate 11 of the circuit board 10. This prevents cracks from occurring at the connections between the insulating substrate 11 and the metal plate 12 and also between the insulating substrate 11 and the metal plate 13, thereby preventing the mold resin 70 from being detached.

(9) The mold resin 70 that covers the side surface 42A of the bonding portion 42 doubles as the resin cover. Therefore, there is no need to provide an additional member to cover the side surface 42A of the bonding portion 42, which leads to a reduced number of components of the semiconductor unit.

Figure 2A:
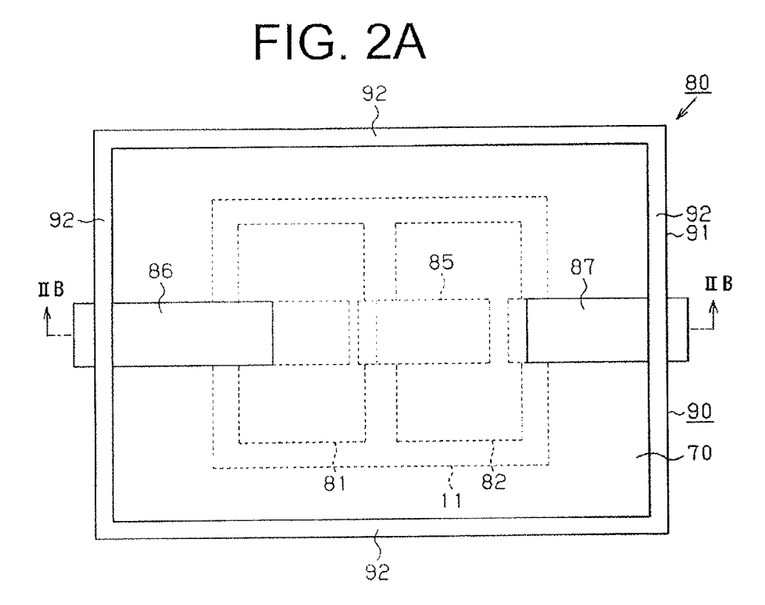
FIG. 2A is a schematic plan view of a second embodiment of the semiconductor unit according to the present invention.
Figure 2B:
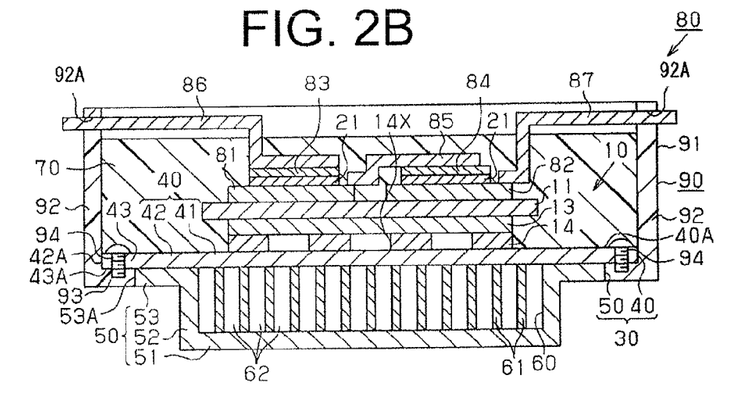
FIG. 2B is a cross-sectional view taken along the line IIB-IIB of FIG. 2A.

FIGS. 2A and 2B show the second embodiment of the semiconductor unit according to the present invention. In the drawings, same reference numerals are used for the common elements or components in the first and second embodiments, and the description of such elements or components of the second embodiment will be omitted or simplified.

As shown in FIGS. 2A and 2B, the semiconductor unit which is designated generally by 80 has the circuit board 10 in which a first metal plate 81 and a second metal plate 82 are bonded to the upper surface of the insulating substrate 11 and the metal plate 13 is bonded to the lower surface of the insulating substrate 11.

Semiconductor devices 83, 84 are mounted to the first and second metal plates 81, 82, respectively, through the solder layers 21. Each of the first and second metal plates 81, 82 serve as a wiring layer. A bus bar 85 is provided to electrically connect the upper surface of the first metal plate 81 to the upper surface of the semiconductor device 84. An electrode 86 is connected to the upper surface of the semiconductor device 83, and an electrode 87 is connected to the upper surface of the second metal plate 82. The electrodes 86, 87 are connected to a power source (not shown).

A resin case 90 (resin cover) is screwed to the extension 43 of the upper plate 40. The case 90 has side walls 92 forming a box shaped body 91 of the case 90 and a fastening portion 93 extending horizontally inward of the body 91 from the lower end of each side wall 92. The distance between the opposite side walls 92 of each pair is substantially equal to the distance between their corresponding paired opposite side surfaces 42A of the upper plate 40.

With the upper surface of the fastening portion 93 of the case 90 set in contact with the lower surface 43A of the extension 43 of the upper plate 40, a screw 94 is screwed through the extension 43 into a threaded hole in the fastening portion 93 to fix the case 90. In the case 90 thus fixed to the upper plate 40, the inner peripheral surfaces of the fastening portion 93 are in contact with the side surfaces 53A of the bonding portion 53. The distance between the opposite side walls 92 of each pair is substantially equal to the distance between their corresponding paired opposite side surfaces 42A of the upper plate 40, and the inner surfaces of the side walls 92 are in contact with the side surfaces 42A. The side walls 92 of the case 90 covers the side surfaces 42A (second surface) of the upper plate 40.

The case 90 has a rectangular hole 92A formed through the upper part of each of one pair of opposite side walls 92. The electrodes 86, 87 are inserted through the respective holes 92A in such a way that the electrodes 86, 87 are supported by the side walls 92. Part of the respective electrodes 86, 87 exposed out of the case 90 serves as the terminals which are to be connected to the power source. The side walls 92 of the case 90 also serve as the support for such terminals.

The opening of the case 90 adjacent to the fastening portion 93 is closed by the upper plate 40 that is screwed at the extension 43 thereof to the case 90. The upper plate 40 serves as the bottom of the case 90. The case 90 is filled with the mold resin 70 in such a way that the mold resin 70 covers the upper surface 40A of the upper plate 40. In the semiconductor unit 80 of the second embodiment, the mold resin 70 and the case 90 cooperate to cover the entire of the extension 43. Specifically, the mold resin 70 covers the upper surface of the extension 43 or the upper surface 40A of the upper plate 40, and the case 90 covers the side surface of the extension 43 or the side surface 42A of the bonding portion 42 and the lower surface 43A of the extension 43. The fastening portion 93 of the case 90 covers the side surface 53A of the bonding portion 53.

When thermal stress occurs in the semiconductor unit 80 and the heat sink 30 receives a force tending to cause the heat sink 30 to expand horizontally in the extending direction of the bonding surface between the upper plate 40 and the mold resin 70, the side surfaces 42A, 53A of the bonding portions 42, 53 of the upper and lower plates 40, 50 press the case 90, while the bonding portions 42, 53 receive reaction force from the case 90. Such reaction force serves to restrict the expansion of the heat sink 30. The case 90 also serves to restrict the mold resin 70 from expanding horizontally in the extending direction of the bonding surface between the upper plate 40 and the mold resin 70. If there is a large difference in the coefficient of linear expansion between the heat sink 30 and the mold resin 70, the difference in the amount of expansion between the heat sink 30 and the mold resin 70 is small, which prevents the mold resin 70 from being detached from the heat sink 30.

The second embodiment offers the following advantages, as well as the advantages (1), and (4) to (8) of the first embodiment.

(10) The case 90 covers the side surfaces 42A, 53A of the bonding portions 42, 53 and the mold resin 70, thereby restricting the horizontal expansion of the heat sink 30 and the mold resin 70. If there is a large difference in the coefficient of linear expansion between the heat sink 30 and the mold resin 70, the difference in the amount of expansion between the heat sink 30 and the mold resin 70 is small, which prevents the mold resin 70 from being detached from the heat sink 30 and hence increases the reliability of the connection between the heat sink 30 and the mold resin 70.

(11) The case 90 is used not only as a mold in which the mold resin 70 is poured, but also as the resin cover, which results in a reduced number of components.

(12) The case 90 is fixed with its fastening portion 93 screwed to the extension 43 of the upper plate 40. The extension 43 can be used as a flange for fixing the case 90 to the upper plate 40 of the heat sink 30.

(13) The fastening portion 93 of the case 90 covers the lower surface 43A of the extension 43 of the upper plate 40. The mold resin 70 and the case 90 serve to restrict the expansion of the upper plate 40 in the direction of its thickness, which prevents the mold resin 70 from being detached from the side surface 42A of the bonding portion 42.

(14) The case 90 is used as a support for the terminal. When the mold resin 70 is poured in the case 90, the electrodes 86, 87 are supported by the case 90. There is no need to provide an additional member for supporting the electrodes 86, 87 when the mold resin 70 is poured in the case 90.

The above embodiments may be modified in various ways as exemplified below.

The mold resin 70 does not necessarily need to cover the side surface 53A of the bonding portion 53 of the lower plate 50 as in the case of the first embodiment. It may be so modified that the mold resin 70 covers the side surface 42A of the bonding portion 42 of the upper plate 40, but the lower surface 43A of the extension 43 is exposed out of the mold resin 70. This may reduce the amount of the mold resin 70 and hence the manufacturing cost of the semiconductor unit 1. Such structure offers the advantages similar to the advantages (1), (2), (4) to (6), and (8) of the first embodiment.

Figure 3:
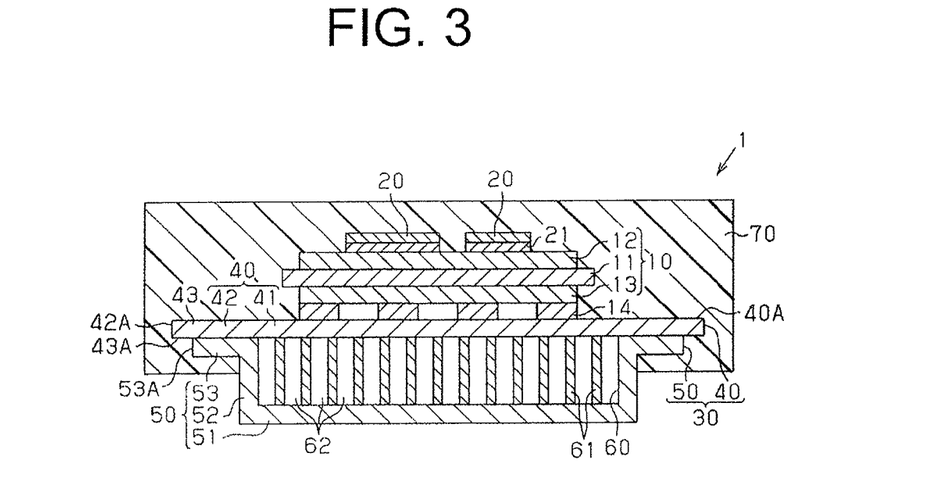
FIGS. 3 to 10 are schematic sectional views of alternative embodiments of the semiconductor unit according to the present invention.

The first embodiment may be modified in such a way that the mold resin 70 covers the lower surface of the bonding portion 53 and also part of the outer surface of the vertical portion 52, as shown in FIG. 3. Such configuration increases the force of the mold resin 70 that serves to restrict the horizontal expansion of the heat sink 30 and hence increases the reliability of the connection between the heat sink 30 and the mold resin 70. The heat sink 30 is sealed tightly, resulting in improved heat radiation.

Figure 4:
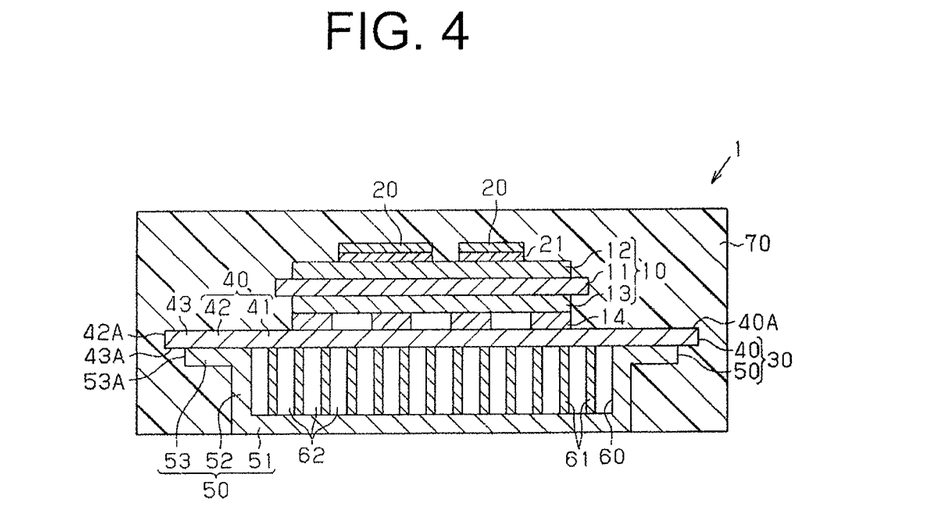

The first embodiment may be modified in such a way that the mold resin 70 covers the lower surface of the bonding portion 53 and also the entire of the outer surface of the vertical portion 52, as shown in FIG. 4. Such configuration increases the force of the mold resin 70 that serves to restrict the horizontal expansion of the heat sink 30 as compared to the case of FIG. 3, thereby further increasing the reliability of the connection between the heat sink 30 and the mold resin 70. The heat sink 30 is sealed tightly, resulting in improved heat radiation.

The first embodiment may be modified in such a way that the mold resin 70 covers the lower surface of the bonding portion 53, the entire of the outer surface of the vertical portion 52 and also the entire of the lower surface of the base 51 thereby to cover the entire of the heat sink 30.

Figure 5:
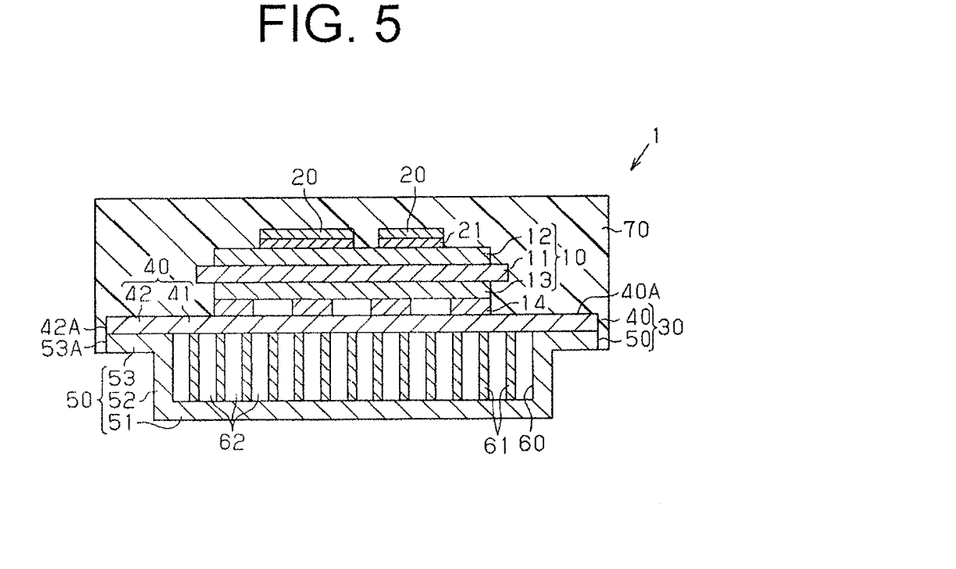

The first embodiment may be modified in such a way that the bonding portion 42 of the upper plate 40 has no extension such as 43, as shown in FIG. 5. Such structure offers the advantages similar to the advantages (1), (2), (4) to (6), and (8) of the first embodiment. This modification may be further modified in such a way that the mold resin 70 covers the lower surface of the bonding portion 53, covers the lower surface of the bonding portion 53 and the entire of the outer surface of the vertical portion 52, or covers the entire of the heat sink 30. In a similar manner, the second embodiment may be modified in such a way that the bonding portion 42 of the upper plate 40 has no extension such as 43. In this case, the fastening portion 93 of the case 90 may be disposed covering the lower surface of the bonding portion 53 of the lower plate 50 and screwed to the bonding portion 53.

Figure 6:
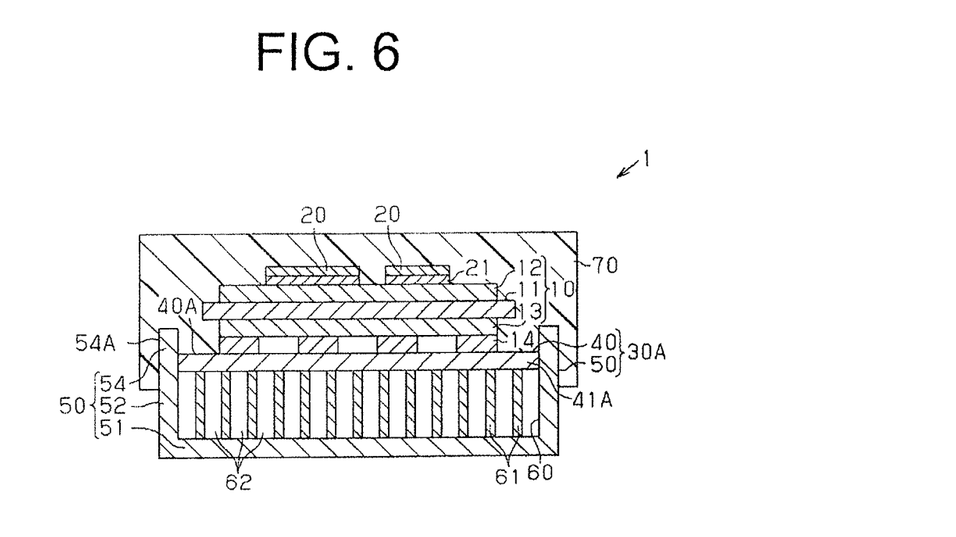

In the first embodiment, the heat sink 30 may be replaced by a heat sink 30A (cooler) including the upper and lower plates 40, 50 as shown in FIG. 6. Specifically, the base 41A of the upper plate 40 is of a rectangular planar shape and extends horizontally to form the top for the fluid flow space 60. The base 41A is bonded at its side surface to the lower plate 50. The base 51 of the lower plate 50 is of a rectangular planar shape and extends horizontally to form the bottom for the fluid flow space 60. The vertical portion 52 of the lower plate 50 extends vertically upward from the periphery of the base 51 to form a side wall for the fluid flow space 60. The vertical portion 52 is bonded at its inner surface to the upper plate 40. The side surface of the base 41A of the upper plate 40 is brazed to the inner surface of the vertical portion 52 of the lower plate 50. The interior space formed by the base 41 of the upper plate 40, the base 51 and the vertical portion 52 of the lower plate 50 corresponds to the fluid flow space 60. The lower plate 50 has an extension 54 that extends upward from the vertical portion 52 beyond the upper surface 40A of the upper plate 40. The extension 54 has a side surface 54A that extends vertically upward from the upper surface 40A of the upper plate 40.

In the semiconductor unit 1 with such structure, the upper surface 40A of the upper plate 40, the side surface 54A of the extension 54 and part of the outer surface of the vertical portion 52 in the lower plate 50, the stress relief member 14, the circuit board 10 and the semiconductor devices 20 are covered by the mold resin 70.

Such structure also prevents the mold resin 70 from being detached from the heat sink 30A. Specifically, when the heat sink 30A receives a force tending to cause the heat sink 30A to expand horizontally in the extending direction of the bonding surface between the upper plate 40 and the mold resin 70, the side surface of the vertical portion 52 and the side surface 54A of the extension 54 press the mold resin 70, while the vertical portion 52 and the extension 54 of the lower plate 50 receive reaction force from the mold resin 70. Such reaction force serves to restrict the expansion of the lower plate 50 and hence the horizontal expansion of the upper plate 40 bonded to the lower plate 50. If there is a large difference in the coefficient of linear expansion between the heat sink 30A and the mold resin 70, the difference in the amount of expansion between the heat sink 30A and the mold resin 70 is small, which prevents the mold resin 70 from being detached from the heat sink 30A.

The heat sink 30A has no bonding portion such as 42, 53 of FIG. 1 extending outwardly of the fluid flow space 60, resulting in the heat sink 30A of a smaller profile.

Figure 7:
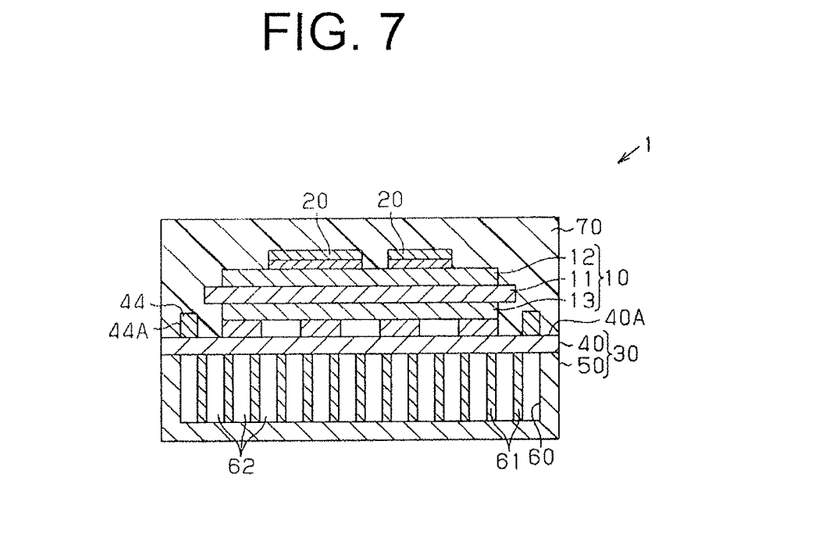

It may be so modified that the upper plate 40 has a projection 44 on its upper surface 40A and the entire of the projection 44 is molded by the mold resin 70, as shown in FIG. 7. The projection 44 is formed integrally with the upper plate 40 and has a side surface 44A (second surface) that extends upward from the upper surface 40A of the upper plate 40. The projection 44 may be provided, for example, by a screw or boss. The projection 44 is made of a material having a coefficient of linear expansion that is close to that of the heat sink 30, such as aluminum-based metal.

Such structure also prevents the mold resin 70 from being detached from the heat sink 30. Specifically, when the heat sink 30 receives a force tending to cause the heat sink 30 to expand horizontally, the side surface 44A of the projection 44 presses the mold resin 70, while the projection 44 receives reaction force from the mold resin 70. Such reaction force serves to restrict the expansion of the projection 44 and hence the horizontal expansion of the upper plate 40 where the projection 44 is formed. If there is a large difference in the coefficient of linear expansion between the heat sink 30 and the mold resin 70, the difference in the amount of expansion between the heat sink 30 and the mold resin 70 is small, which prevents the mold resin 70 from being detached from the heat sink 30.

In addition, the side surface of the heat sink 30 is exposed out of the mold resin 70, which may reduce the amount of the mold resin 70 and hence the manufacturing cost of the semiconductor unit 1.

Figure 8:
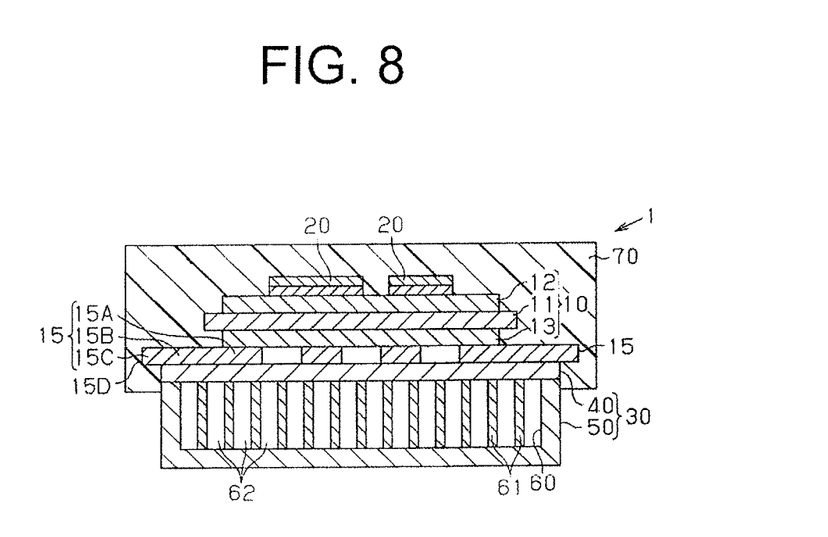

In the embodiments shown in FIGS. 1, 3, 4 and 5, the mold resin 70 covers the side surfaces 42A, 53A of the bonding portions 42, 53 both extending outward of the fluid flow space 60. Alternatively, it may be so modified that the mold resin 70 covers the entire of a stress relief member 15 interposed between the metal plate 13 of the circuit board 10 and the heat sink 30 and extending outward of the heat sink 30 or the fluid flow space 60, as shown in FIG. 8. Specifically, the stress relief member 15 (intermediate member) includes a base 15A brazed to both the metal plate 13 and the upper plate 40, a bonding portion 15B brazed only to the upper plate 40, and an extension 15C extending outward of the heat sink 30 or the fluid flow space 60. The extension 15C has a side surface 15D (second surface) that extends downward from the upper surface (first surface) of the stress relief member 15. The mold resin 70 covers the upper surface of the stress relief member 15 and the side surface 15D and the lower surface of the extension 15C. The mold resin 70 covering the side surface 15D and the lower surface of the extension 15C serves to restrict the expansion of the stress relief member 15. If there is a large difference in the coefficient of linear expansion between the stress relief member 15 and the mold resin 70, the difference in the amount of expansion between the stress relief member 15 and the mold resin 70 is small, which prevents the mold resin 70 from being detached from the stress relief member 15. In addition, the structure of FIG. 8 leads to an increased bonding area between the stress relief member 15 and the heat sink 30, as compared to the case that the stress relief member is disposed only at a position immediately below the semiconductor device 20. The stress relief member 15 may be used in the second embodiment so that the extension 15C is screwed to the fastening portion 93 of the case 90.

The semiconductor unit 1 shown in FIG. 8 does not necessarily require the metal plate 13. In this case, the base 15A of the stress relief member 15 is brazed to the insulating substrate 11 and the upper plate 40. Similarly, the semiconductor unit 80 of the second embodiment does not necessarily require the metal plate 13.

Figure 9:
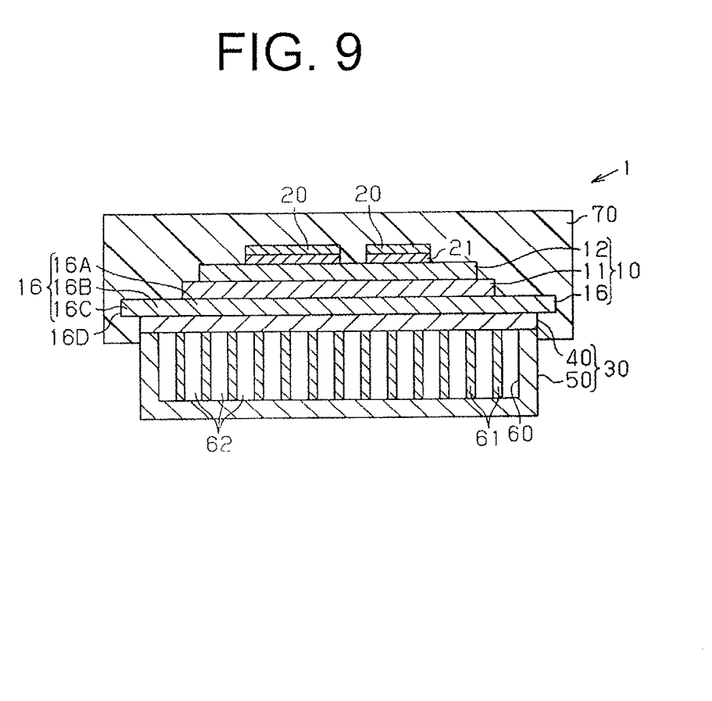

Alternatively, it may be so modified that the mold resin 70 covers the entire of a metal plate 16 replacing the metal plate 13 and the stress relief member 15 of FIG. 8 and extending outward of the heat sink 30 or the fluid flow space 60, as shown in FIG. 9. Specifically, the metal plate 16 (intermediate member) includes a base 16A bonded to both the insulating substrate 11 and the upper plate 40, a bonding portion 16B bonded to the upper plate 40, and an extension 16C extending outward of the heat sink 30 or the fluid flow space 60. The extension 16C has a side surface 16D (second surface) that extends downward from the upper surface (first surface) of the metal plate 16. The mold resin 70 covers the upper surface of the metal plate 16 and the side surface 16D and the lower surface of the extension 16C. The mold resin 70 covering the side surface 16D and the lower surface of the extension 16C serves to restrict the expansion of the metal plate 16. If there is a large difference in the coefficient of linear expansion between the metal plate 16 and the mold resin 70, the difference in the amount of expansion between the metal plate 16 and the mold resin 70 is small, which prevents the mold resin 70 from being detached from the metal plate 16. In addition, the structure of FIG. 9 leads to an increased bonding area between the metal plate 16 and the heat sink 30, as compared to the case that the metal is disposed only at a position immediately below the semiconductor device 20.

In the embodiments shown in FIGS. 1, 3, 4 and 5, the side surface 42A of the bonding portion 42 covered by the mold resin 70 does not necessarily need to extend perpendicularly to the upper surface 40A of the upper plate 40.

In the second embodiment, the case 90 does not necessarily require the fastening portion 93. For example, the case 90 may be fixed to the upper plate 40 in such a way that the inner surface of the side walls 92 of the case 90 is bonded to the side surface 42A of the bonding portion 42 by adhesive. Alternatively, the screw 94 may be screwed through the side wall 92 into a threaded hole in the side surface 42A of the bonding portion 42 to fix the case 90. The case 90 may be fixed by any other suitable method.

In the second embodiment, the screw 94 is screwed through the fastening portion 93 into a threaded hole in the extension 43.

Not only water but also other liquid such as alcohol or a gas such as air may be used as the coolant flowing through the fluid flow space 60 of the heat sink 30.

The partition wall 61 of the heat sink 30 may be of any suitable shape. For example, corrugated fins may be provided between the upper and lower plates 40, 50.

The heat sink 30 does not necessarily require the partition walls 61.

The cross section of the holes 14X of the stress relief member 14 may be of any suitable shape such as circular, elliptical or square as long as the holes 14X function to reduce the thermal stress occurring in the stress relief member 14.

The number of components mounted on the heat sink 30 may be changed. For example, two or more metal plates such as 12 may be mounted on the insulating substrate 11 and one or three or more semiconductor devices 20 may be mounted on each metal plate 12.

The semiconductor units 1, 80 do not necessarily require the stress relief member 14.

The semiconductor units 1, 80 do not necessarily require the metal plate 13.

The semiconductor units 1, 80 are not limited to in-vehicle use.

Figure 10:
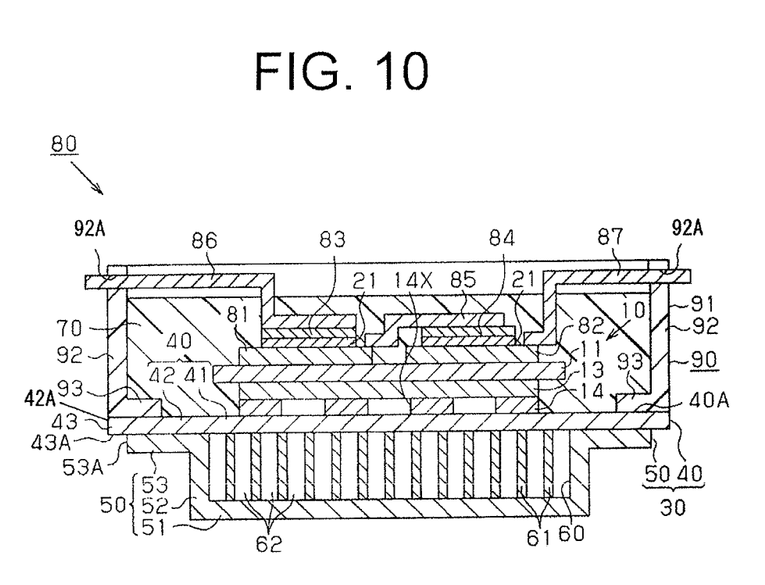

The second embodiment may be modified in such a way that the case 90 is fixed to the upper surface of the extension 43 or the upper surface 40A of the upper plate 40 and also that the inner surfaces of the respective side walls 92 of the case 90 are located inward of the side surfaces 42A of the bonding portion 42 of the upper plate 40, as shown in FIG. 10. The structure of FIG. 10 may reduce the capacity of the case 90, thereby reducing the amount of the mold resin 70 poured in the case 90 and hence the manufacturing cost of the semiconductor unit 80.

What is claimed is:

1. A semiconductor unit, comprising:
a cooler having a fluid flow space;
an insulating substrate bonded to the cooler through a metal;
a semiconductor device soldered to the insulating substrate;
an intermediate member interposed between the insulating substrate and the fluid flow space and having a first surface where the insulating substrate is mounted; and
a mold resin having a lower coefficient of linear expansion than the intermediate member, wherein the insulating substrate, the semiconductor device and the cooler are molded by the mold resin, and a base of the cooler extending outward from the mold resin,
wherein the intermediate member has a second surface that extends upward or downward relative to the first surface, the first surface is covered by the mold resin, and the second surface is covered by a resin cover.

2. The semiconductor unit of claim 1, wherein the resin cover corresponds to the mold resin.

3. The semiconductor unit of claim 2, wherein the cooler includes a first plate and a second plate bonded together, the first plate corresponds to the intermediate member, a projection having the second surface formed on the first surface of the first plate, and the entire projection is covered by the mold resin.

4. The semiconductor unit of claim 1, wherein the resin cover is a resin case fixed to the intermediate member and filled with the mold resin.

5. The semiconductor unit of claim 4, wherein the cooler includes a first plate having a first base and a first bonding portion extending outward from the first base; and a second plate having a second base and a second bonding portion extending outward from the second base and bonded to the first bonding portion so that the fluid flow space is formed between the first base and the second base,
wherein the intermediate member corresponds to the first plate, the second surface corresponds to a side surface of the first bonding portion of the first plate, and
wherein the first bonding portion extends beyond the second bonding portion to form an extension, the entire extension is covered by the mold resin and the resin case.

6. The semiconductor unit of claim 5, wherein the resin case has a fastening portion screwed to the extension of the first plate.

7. The semiconductor unit of claim 1, wherein the cooler includes a first plate having a first base and a first bonding portion extending outward from the first base; and a second plate having a second base and a second bonding portion extending outward from the second base and bonded to the first bonding portion so that the fluid flow space is formed between the first base and the second base,
wherein the intermediate member corresponds to the first plate, and the second surface corresponds to a side surface of the first bonding portion of the first plate.

8. The semiconductor unit of claim 7,
wherein the under surface of the second base or the second bonding portion are on the same level with the under surface of the mold resin.

9. The semiconductor unit of claim 7, wherein the first bonding portion extends beyond the second bonding portion to form an extension, and the entire extension is covered by the mold resin and the resin cover.

10. The semiconductor unit of claim 7, wherein the cooler includes fins in the fluid flow space, and the entire first and second bonding portions are covered by the mold resin and the resin cover.

11. The semiconductor unit of claim 1,
further comprising a metal plate bonded on the side of the insulating substrate opposite from the semiconductor device,
wherein the intermediate member is a stress relief member interposed between the cooler and the metal plate, the stress relief member includes a base brazed to the cooler and the metal plate and an extension extending outward of the cooler and having the second surface, and the entire extension is covered by the mold resin and the resin cover.

12. The semiconductor unit of claim 1,
wherein the intermediate member is a stress relief member interposed between the cooler and the insulating substrate, the stress relief member includes a base brazed to the cooler and the insulating substrate and an extension extending outward of the cooler and having the second surface, and the entire extension is covered by the mold resin and the resin cover.

13. The semiconductor unit of claim 1,
wherein the intermediate member is a metal plate interposed between the cooler and the insulating substrate, the metal plate includes a base brazed to the cooler and the insulating substrate and an extension extending outward of the cooler and having the second surface, and the entire extension is covered by the mold resin and the resin cover.

14. A semiconductor unit, comprising:
a cooler having a fluid flow space;
an insulating substrate bonded to the cooler through a metal;
a semiconductor device soldered to the insulating substrate;
an intermediate member interposed between the insulating substrate and the fluid flow space and having a first surface where the insulating substrate is mounted; and a mold resin having a lower coefficient of linear expansion than the intermediate member, wherein the insulating substrate, the semiconductor device and the cooler are molded by the mold resin;
wherein the intermediate member has a second surface that extends upward or downward relative to the first surface, the first surface is covered by the mold resin, and the second surface is covered by a resin cover; and a metal plate bonded on the side of the insulating substrate opposite from the semiconductor device;
wherein the intermediate member is a stress relief member interposed between the cooler and the metal plate, the stress relief member includes a base brazed to the cooler and the metal plate and an extension extending outward of the cooler and having the second surface, and the entire extension is covered by the mold resin and the resin cover.

15. A semiconductor unit, comprising:
a cooler having a fluid flow space;
an insulating substrate bonded to the cooler through a metal;
a semiconductor device soldered to the insulating substrate;
an intermediate member interposed between the insulating substrate and the fluid flow space and having a first surface where the insulating substrate is mounted; and
a mold resin having a lower coefficient of linear expansion than the intermediate member, wherein the insulating substrate, the semiconductor device and the cooler are molded by the mold resin, and a part of the cooler extending outward from the mold resin,
wherein the intermediate member has a second surface that extends upward or downward relative to the first surface, the first surface is covered by the mold resin, and the second surface is covered by a resin cover,
wherein the cooler includes a first plate having a first base and a first bonding portion extending outward from the first base; and a second plate having a second base and a second bonding portion extending outward from the second base and bonded to the first bonding portion so that the fluid flow space is formed between the first base and the second base,
wherein the intermediate member corresponds to the first plate, and the second surface corresponds to a side surface of the first bonding portion of the first plate, and
wherein the under surface of the second base or the second bonding portion are on the same level with the under surface of the mold resin.

16. A semiconductor unit, comprising:
a cooler having a fluid flow space;
an insulating substrate bonded to the cooler through a metal;
a semiconductor device soldered to the insulating substrate;
an intermediate member interposed between the insulating substrate and the fluid flow space and having a first surface where the insulating substrate is mounted; and
a mold resin having a lower coefficient of linear expansion than the intermediate member, wherein the insulating substrate, the semiconductor device and the cooler are molded by the mold resin, and a part of the cooler extending outward from the mold resin,
wherein the intermediate member has a second surface that extends upward or downward relative to the first surface, the first surface is covered by the mold resin, and the second surface is covered by a resin cover,
further comprising a metal plate bonded on the side of the insulating substrate opposite from the semiconductor device,
wherein the intermediate member is a stress relief member interposed between the cooler and the metal plate, the stress relief member includes a base brazed to the cooler and the metal plate and an extension extending outward of the cooler and having the second surface, and the entire extension is covered by the mold resin and the resin cover.

17. A semiconductor unit, comprising:
a cooler having a fluid flow space;
an insulating substrate bonded to the cooler through a metal;
a semiconductor device soldered to the insulating substrate;
an intermediate member interposed between the insulating substrate and the fluid flow space and having a first surface where the insulating substrate is mounted; and
a mold resin having a lower coefficient of linear expansion than the intermediate member, wherein the insulating substrate, the semiconductor device and the cooler are molded by the mold resin, and a part of the cooler extending outward from the mold resin,
wherein the intermediate member has a second surface that extends upward or downward relative to the first surface, the first surface is covered by the mold resin, and the second surface is covered by a resin cover,
wherein the intermediate member is a stress relief member interposed between the cooler and the insulating substrate, the stress relief member includes a base brazed to the cooler and the insulating substrate and an extension extending outward of the cooler and having the second surface, and the entire extension is covered by the mold resin and the resin cover.

18. A semiconductor unit, comprising:
a cooler having a fluid flow space;
an insulating substrate bonded to the cooler through a metal;
a semiconductor device soldered to the insulating substrate;
an intermediate member interposed between the insulating substrate and the fluid flow space and having a first surface where the insulating substrate is mounted; and
a mold resin having a lower coefficient of linear expansion than the intermediate member, wherein the insulating substrate, the semiconductor device and the cooler are molded by the mold resin, and a part of the cooler extending outward from the mold resin,
wherein the intermediate member has a second surface that extends upward or downward relative to the first surface, the first surface is covered by the mold resin, and the second surface is covered by a resin cover,
wherein the intermediate member is a metal plate interposed between the cooler and the insulating substrate, the metal plate includes a base brazed to the cooler and the insulating substrate and an extension extending outward of the cooler and having the second surface, and the entire extension is covered by the mold resin and the resin cover.

\* \* \* \* \*